(12) United States Patent
Yazaki

(10) Patent No.: US 6,841,732 B2
(45) Date of Patent: Jan. 11, 2005

(54) PROTECTION STRUCTURE OF A CIRCUIT BOARD AND METHOD FOR MANUFACTURING THE SAME

(75) Inventor: Takashi Yazaki, Tokyo (JP)

(73) Assignee: NEC LCD Technologies, Ltd., Kanagawa (JP)

(*) Notice: Subject to any disclaimer, the term of this patent is extended or adjusted under 35 U.S.C. 154(b) by 626 days.

(21) Appl. No.: 10/040,071

(22) Filed: Oct. 24, 2001

(65) Prior Publication Data

US 2002/0126461 A1 Sep. 12, 2002

(30) Foreign Application Priority Data

Oct. 25, 2000 (JP) .......................................... 2000-325113

(51) Int. Cl.[7] .............................................. H02G 3/08
(52) U.S. Cl. ...................................... 174/52.1; 361/752
(58) Field of Search ............................... 174/52.1, 52.3, 174/52.4; 257/704; 361/752

(56) References Cited

U.S. PATENT DOCUMENTS

| | | | | |
|---|---|---|---|---|
| 5,394,304 A | * | 2/1995 | Jones | 361/765 |
| 5,485,672 A | * | 1/1996 | Carpenter et al. | 29/841 |
| 5,527,989 A | * | 6/1996 | Leeb | 174/35 GC |
| 5,689,878 A | * | 11/1997 | Dahringer et al. | 29/841 |
| 5,796,583 A | * | 8/1998 | Gale et al. | 361/704 |
| 6,028,775 A | * | 2/2000 | Batten et al. | 361/816 |
| 6,770,813 B1 | * | 8/2004 | Ramsagar et al. | 174/52.1 |

FOREIGN PATENT DOCUMENTS

| | | |
|---|---|---|
| JP | 55-135493 | 3/1954 |
| JP | 58-48499 | 3/1983 |
| JP | 59-128797 | 8/1984 |
| JP | 4-38091 | 3/1992 |
| JP | 4-219996 | 8/1992 |
| JP | 5-29197 | 4/1993 |
| JP | 6-2765 | 1/1994 |
| JP | 6-23272 | 3/1994 |
| JP | 7-74485 | 3/1995 |
| JP | 7-209630 | 8/1995 |
| JP | 3021144 | 11/1995 |
| JP | 2000-68658 | 3/2000 |

* cited by examiner

*Primary Examiner*—Hung V. Ngo
(74) *Attorney, Agent, or Firm*—Choate, Hall & Stewart

(57) ABSTRACT

A structure of the invention is a structure for protecting components mounted on a circuit board mounted on an electronic device such as a liquid crystal display device or the like from an external force, in which a protection cover is freely opened and closed at least at one end of it and fixes at least one end of it to the electronic device side and thereby protects a face of the circuit board opposite to the electronic device from the outside in the minimum height.

Therefore, it is possible to suppress an increase in thickness and a rise in manufacturing cost of an electronic device at the utmost.

20 Claims, 12 Drawing Sheets

PROTECTION STRUCTURE OF A CIRCUIT BOARD AND METHOD FOR MANUFACTURING THE SAME

BACKGROUND OF THE INVENTION

1. Field of the Invention

The present invention relates to a protection structure of a circuit board and a liquid crystal display device and their manufacturing method, and more particularly to a protection structure of a circuit board for protecting electronic components mounted on a circuit board fixed to an electronic device from an external force by covering them with a plate-shaped protective cover, a liquid crystal display device provided with such a protection structure, and a manufacturing method for realizing them.

2. Description of the Prior Art

In recent years, as seen in a display device and the like of a personal computer, a number of display devices each using a liquid crystal display device have been increased.

The reason is that a liquid crystal display device is shorter in depth and more advantageous to space saving in comparison with a CRT display device.

A liquid crystal display device has ordinarily a circuit board for driving a liquid crystal mounted in its display device.

With the demands on a thinner and more space-saving liquid crystal display device, it has been necessary to more contrive in mounting of a circuit board for driving a liquid crystal.

And since the manufacturing cost must be reduced, it is required to reduce the number of components and reduce members to be used in cost. FIG. 1 shows schematically a perspective view of an example of a liquid crystal display device mounted with a circuit board for driving a liquid crystal.

Referring to the same Figure, a circuit board 2 is fixed to the inside of a liquid crystal display device 3 by means of an unshown method such as screwing or the like.

On the circuit board, such electronic components forming a liquid crystal driving circuit as an active component like an IC 15, a passive component like a capacitor 16 and the like for example are mounted in a bare state.

When handling such a liquid crystal display device, for example, temporarily storing it, packing it in a package box or unpacking it, an unintended external force applied to components mounted on the circuit board may cause a trouble of deficiency of a component and the like.

All components mounted on the circuit board 2 are not the same in height. Many tall components projecting higher than other components like an electrolytic capacitor 16 for example (see also FIG. 2 described later) are mounted. In case that mounted components are uneven in height in such a way, it may occur to apply an unintended force to a tall component by mistake when attaching a circuit board to a liquid crystal display device and thereby transform, break or pull it off.

And in a manufacturing process of a liquid crystal display device, a liquid crystal display device mounted with a circuit board may be brought into and from a hand truck having partitions like a bookshelf in order to carry or temporarily store it. When bringing it into and from the hand truck, a tall mounted component may be struck against the hand truck to be broken or pulled off.

Further, also in a process of assembling a liquid crystal display device mounted with a circuit board into a cabinet to form a display unit, a similar trouble may occur.

Thereupon, up to now, in order to protect components mounted on a circuit board from an unintended external force as described above, a liquid crystal display device has been mounted with a cover for protecting components mounted on a circuit board.

FIG. 2 shows a side view of an example of a liquid crystal display device mounted with such a protection cover.

Referring to FIG. 2, a circuit board 2 is fixed to the inside of a liquid crystal display device 3 by screwing or the like, and a protection cover 1 is provided so as to cover the circuit board.

The protection cover 1 is made of metal or plastic and is formed in advance into a shape in which a flat plate connects to each other two legs which are bent respectively to be wrong L-shaped (part at the left side of the page) and L-shaped (part at the right side of the same), and is fixed on a liquid crystal display device 3 by the bent portions of the two legs in parallel with the liquid crystal display device.

In order to fix the protection cover 1, a method using a double sided adhesive tape or an adhesive agent, or screwing is used.

An insulating sheet 8 provided between the circuit board 2 and the liquid crystal display device 3 is intended to electrically insulate both of them from each other.

The reason is that since usually the inside of a liquid crystal display device 3 is often made of metal for electromagnetic shielding and the inside of a circuit board 3 has a wiring pattern for forming a circuit formed on it or has a connecting portion of the wiring and the mounted components provided on it, the circuit board 2 and the display device 3 must be insulated from each other. By providing a protection cover 1 as shown in FIG. 2, it is possible to protect components mounted on a circuit board.

In case of a protective cover 1, however, a display unit having a liquid crystal display device assembled in it is made thicker by providing this cover.

This is a problem which cannot be neglected to a liquid crystal display device required to be space-saving.

And this problem results in raising the manufacturing cost due to increasing not only the number of components but also a manufacturing man-hour for mounting a protection cover.

SUMMARY OF THE INVENTION

Therefore, the present invention aims at suppressing to the utmost an increase in thickness and a rise in manufacturing cost of an electronic device in case of covering components mounted on a circuit board mounted on a face of an electronic device such as a liquid crystal display device with a protection cover and thereby protecting them from an external force. A protection structure of a circuit board of the present invention has a basic structure provided with a protection cover for protecting electronic components on a circuit board in which at least a part of one face of said circuit board is fixed to an electronic device and an area of the other face mounted with electronic components is opened to the outside, wherein at least one end of the protection cover can be freely opened and closed, and in case that the protection cover displays a function of protecting the electronic components from the outside, at least one end of the protection cover is fixed to a protection cover fixing means provided at the electronic device side.

As a first preferred embodiment of a protection structure of a circuit board of the present invention, in a protection structure of a circuit board of a basic structure, a protection cover fixing means is a hook portion formed out of a hook-shaped structure projecting from one end of the circuit board.

As a second preferred embodiment of a protection structure of a circuit board of the present invention, in a protection structure of a circuit board of a basic structure, a protection cover fixing means is a hook portion formed out of a hook-shaped structure projecting from an electronic device near one end of the circuit board.

As a third preferred embodiment of a protection structure of a circuit board of the present invention, in a protection structure of a circuit board of a basic structure, a protection cover is provided with a first engaging portion one end of which is engaged with the electronic device side, a protective portion which starts from the first engaging portion, reaches the electronic component mounting face of the circuit board as being curved and extends to the other end of the circuit board and thereby covers electronic components mounted on the circuit board, and a second engaging portion provided by bending the fore-end portion of the protective portion, and at least one of the first and second engaging portions is fixed to a protection cover fixing means so as to be freely opened and closed. Hereupon, in the third preferred embodiment of a protection structure of a circuit board of the present invention, by engaging at least one engaging portion of the protection cover with the protection cover fixing means, it is possible to prevent the protective portion of the protection cover from rising apart from the electronic component mounting face of the circuit board.

The above-mentioned protection structure of a basic structure can be realized by a method for manufacturing a protection structure of a circuit board, comprising the steps of fixing a circuit board to an electronic device, and engaging at least one end of a protection cover with a protection cover fixing means provided at said electronic device side and thereby protecting a side of said circuit board being not covered with said electronic device from the outside.

DETAILED DESCRIPTION OF THE PREFERRED EMBODIMENTS

Figure 3A:
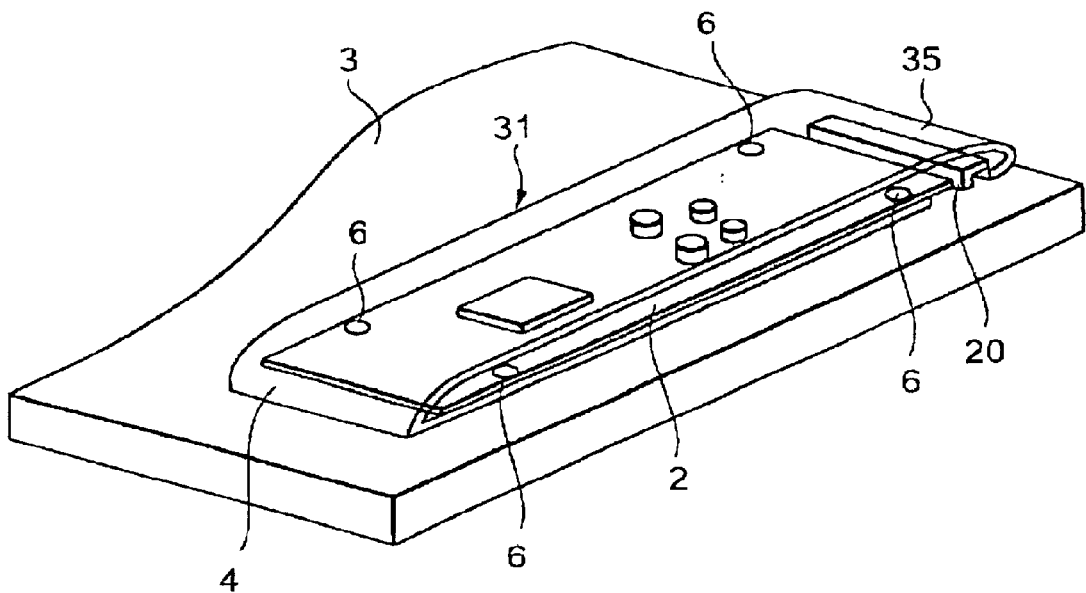
FIG. 3A is a see-through perspective view of a liquid crystal display device mounted with a circuit board according to embodiment 1 of the present invention.
Figure 3B:
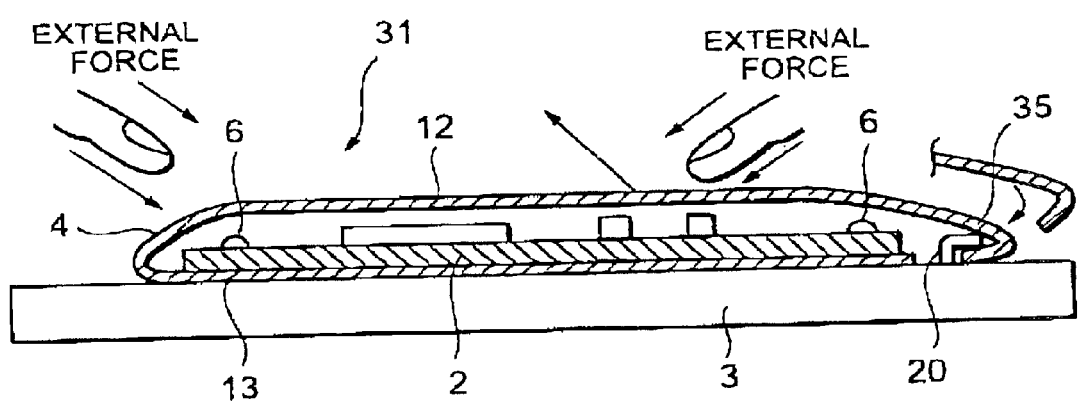
FIG. 3B is a side view of it.

Referring to FIGS. 3A and 3B, a circuit board 2 for driving a liquid crystal is fixed to the inside of a liquid crystal display device 3 by screws 6, and a protection cover 31 covers the circuit board 2.

The protection cover 31 is made of a flexible plate made of plastic, and has a cover portion 12 and an insulating portion 13 connected with each other.

The insulating portion 13 is a part interposed between the circuit board 2 and the liquid crystal display device 3, and electrically insulates both of them from each other.

The cover portion 12 is a part which is bent upward on the page at the left end of the insulating portion 13, extends over the component mounting face of the circuit board so as to wrap the left end of the circuit board 2 and further extends to the right end of the circuit board, and it covers the circuit board 2 to protect the mounted components on the circuit board.

This embodiment forms an insulating sheet 8 (see FIG. 2) which has been provided separately from a protection cover 1 in the prior art into one body together with a protection cover and thereby reduces the number of components by one. The protection cover 31 is provided with an engaging portion 35 made by bending the fore-end of the cover portion 12 inward at an acute angle.

On the other hand, a hook 20 being upside down L-shaped is provided on a spot of the liquid crystal display device 3 near the right end of the circuit board, and prevents the cover portion 12 from rising upward on the page by engaging the engaging portion 35 of the protection cover with the hook-shaped portion of the hook 20 from the outside. The cover portion 12 of the protection cover protects components mounted on the circuit board 2 by making an external force bound away or slip off on a curved portion (round portion 4) ranging from the insulating portion 13 to the cover portion 12 or on the cover portion 12.

And the engaging portion 35 also must be bent by a certain force to be engaged with the hook-shaped portion of the hook 20 from the outside.

Therefore, a material for the protection cover 31 is required to be of electrical insulation, be able to be roundly curved and be so thick and elastic that it can relieve an external force by repulsion or slipping.

As an example, a material of PET (polyethylene terephthalate) of 0.3 to 0.5 mm in thickness is preferable.

When this material is used, the round portion 4 is naturally formed by a force for engaging the engaging portion 35 with the hook 20 at a time of a protection cover mounting operation (described later).

Or the curvature of the round portion 4 may be formed in advance. The protection cover 31 according to embodiment 1 shown in FIG. 3 is mounted in a manner as described below.

Figure 4:
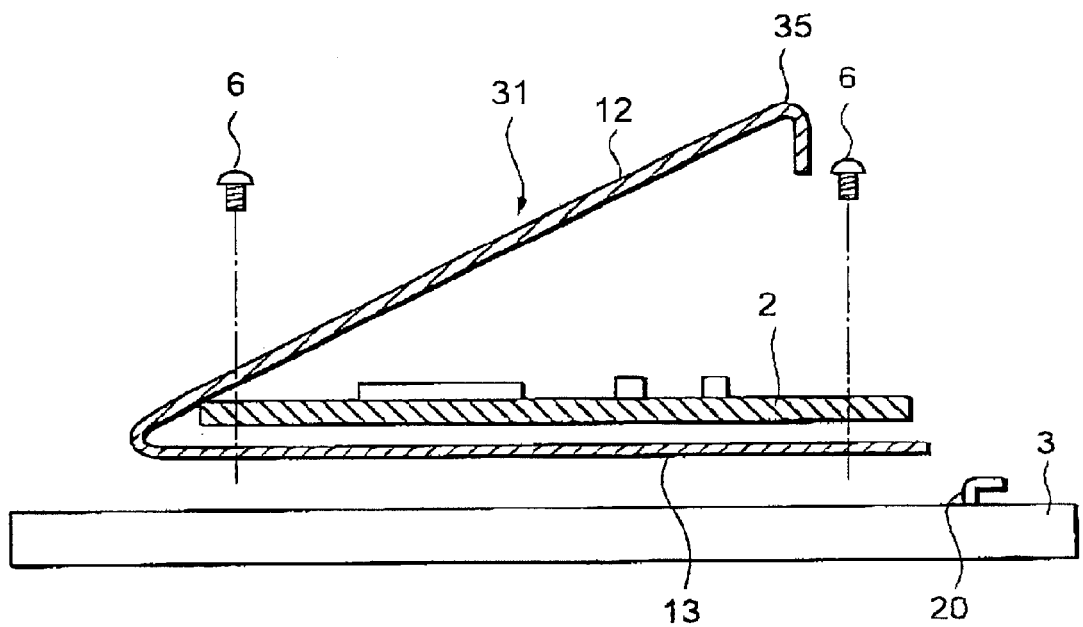
FIG. 4 is a side view at a midway stage when mounting a protection cover by means of a first mounting method in embodiment 1.

Referring to FIG. 4 showing a side view at a midway stage of mounting the protection cover, the cover portion 12 is kept open upward in a state where the protection cover 31, the circuit board 2 and the liquid crystal display device 3 are separated.

And the circuit board 2 is placed on the insulating portion 13 of the protection cover 31 and is screwed to the liquid crystal display device 3 through the insulating portion 13 and thereafter the engaging portion 35 is engaged with the hook 20.

In the present invention, basically in order to fix the protection cover to the circuit board, both the right and left ends of the cover portion 12 must be engaged with both ends of the circuit board 2 or with hook-shaped hooks provided at the liquid crystal display device side, but the above-mentioned mounting method results in attaining the same effect as engaging the left end of the cover portion 12 with the left end of the circuit board 2 simultaneously at this time by screwing the insulating portion 13 of the protection cover together with the circuit board 2 to the liquid crystal display device 3. The protection cover 31 shown in FIG. 3 can be also mounted by another method shown in FIG. 5 in addition to the above-mentioned mounting method.

Figure 5:
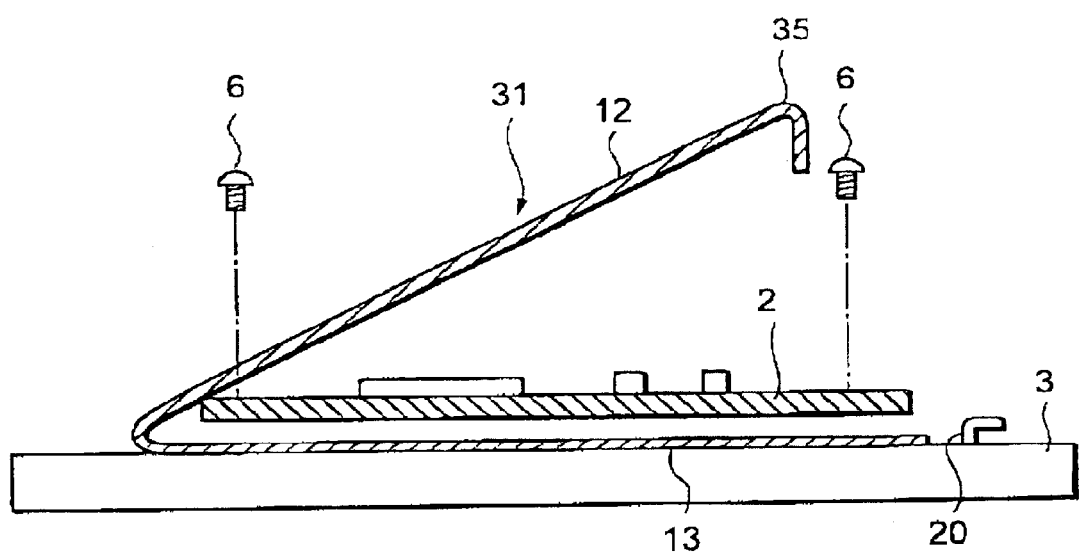
FIG. 5 is a side view at a midway stage when mounting a protection cover by means of a second mounting method in embodiment 1.

That is, referring to FIG. 5 showing a side view at a midway stage of mounting the protection cover by means of a second method, the insulating portion 13 of the protection cover is first fixed to the liquid crystal display device 3 in advance and the cover portion 12 is kept open.

A double sided adhesive tape is used for this fixing.

Or an adhesive agent may be used.

Next, the circuit board 2 is placed on the insulating portion 13 and is screwed through the insulating portion 13 to the liquid crystal display device 3.

Finally, the engaging portion 35 is engaged with the hook 20 to fix the cover portion 12.

This mounting method also results in attaining the same effect as engaging the left end of the cover portion 12 with the left end of the circuit board 2 simultaneously when screwing the circuit board 2 to the liquid crystal display device 3. In embodiment 1 described above, as shown in FIG. 3, the hook-shaped hook 20 provided on the liquid crystal display device is made upside down L-shaped and the bent fore-end of the engaging portion 35 is engaged with the hook 20 from the outside, but the engaging mechanism is not limited to this.

Figure 6:
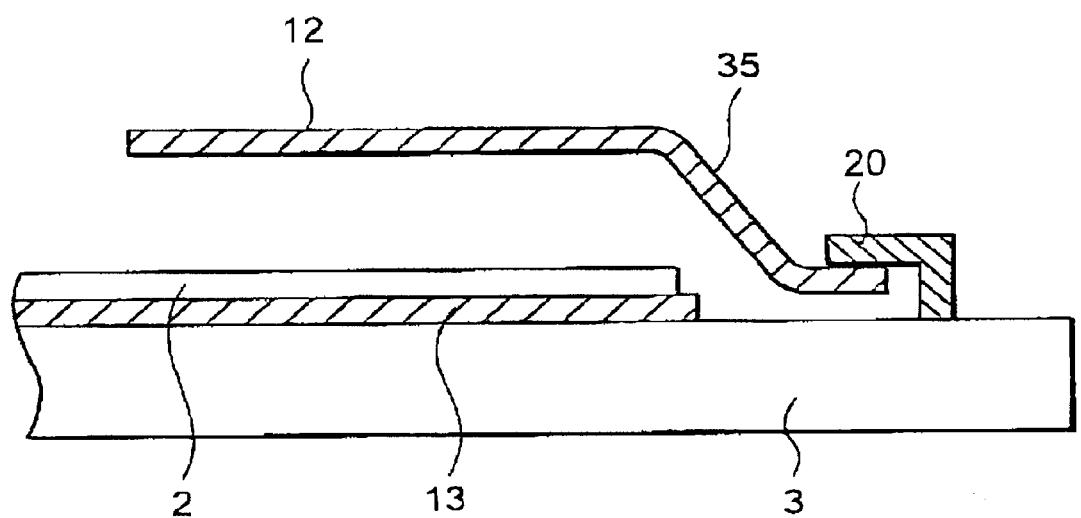
FIG. 6 is a side view schematically showing another example of an engaging mechanism in embodiment 1.

As shown in FIG. 6, a structure may be adopted in which the direction of the engaging portion of the hook 20 provided on the liquid crystal display device is inward reversely to the hook shown in FIG. 3 and the engaging portion 35 is pressed into the hook 20 (FIG. 6 shows a main part of the engaging mechanism). In this case the engaging portion 35 is obtained by bending the fore-end of the cover portion 12 outward at an obtuse angle.

In either case that the hook 20 of the liquid crystal display device side is shaped as shown in FIG. 3 or in FIG. 6, the number of components is reduced by one through forming the cover portion 12 and the insulating portion 13 as one body.

Further, by fixing the left end of the cover portion 12 to the circuit board 2 at the same time when fixing the circuit board 2 to the liquid crystal display device 3, a mounting operation is simplified so that the protection cover is fixed only by engaging the engaging portion 35 with the hook 20 from the outside or pressing the engaging portion 35 into the hook 20 from the inside.

Figure 1:
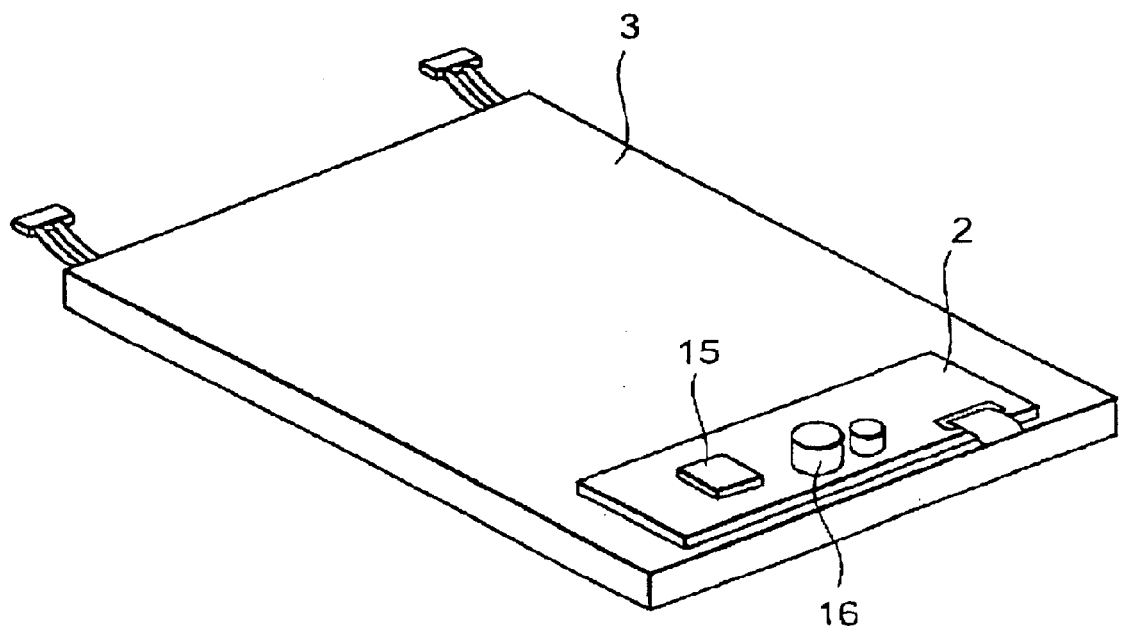
FIG. 1 is a schematic perspective view of a conventional liquid crystal display device mounted with a circuit board having no protective means of mounted components.
Figure 2:
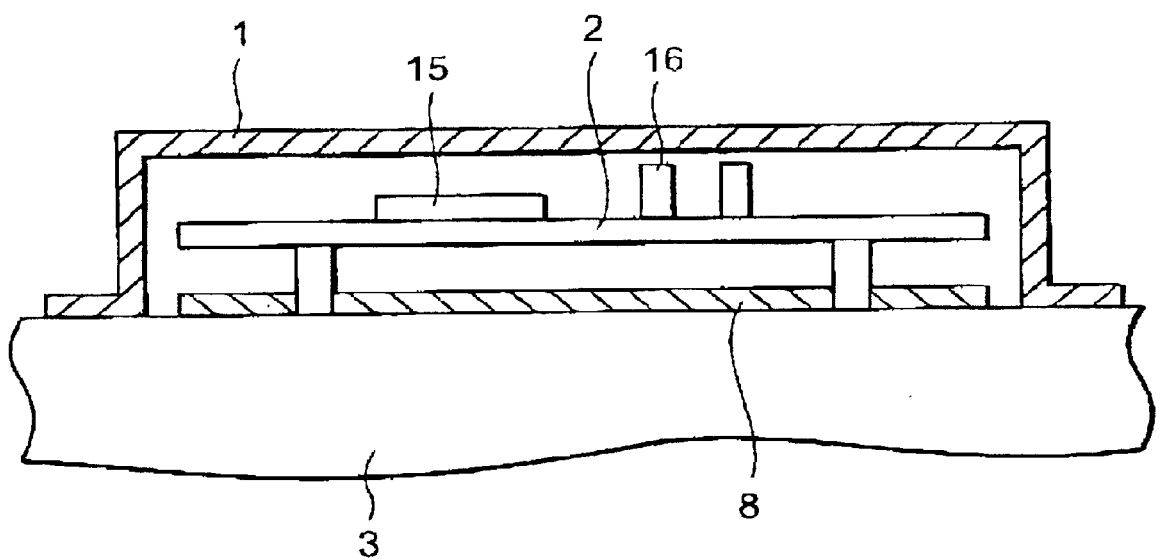
FIG. 2 is a schematic perspective view of a conventional liquid crystal display device mounted with a circuit board having a protection cover.

In such a way, according to this embodiment, in addition to a fact that the manufacturing cost is reduced only by reducing the number of components in comparison with the conventional protection cover shown in FIG. 2, since the man-hour of a protection cover mounting operation is reduced by simplifying the mounting operation, the manufacturing cost can be reduced also from this point.

And as apparently seen from the description of embodiment 1, it will be understood that it is enough that the protection cover 1 is freely opened and closed at least at one end of it and only when the circuit board 2 needs to be shielded from the outside the cover portion 12 covers the circuit board 2 by being engaged with the hook-shaped hook 20 provided on the liquid crystal display device.

Next, the above-mentioned embodiment 1 is an example which provides the hook 20 on the liquid crystal display device 3 as an engaging mechanism for fixing the engaging portion 35 of the protection cover, but as shown in embodiments 2 to 4 described in the following, by providing an adequate gap between a circuit board 2 and a liquid crystal display device 3, the end portion of the circuit board 2 can be used as a mechanism for fixing the engaging portion 35.

Figure 7:
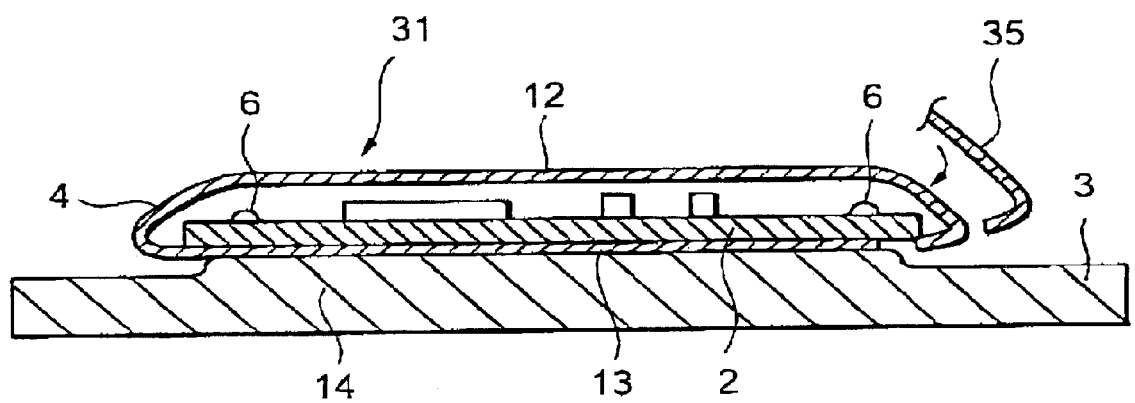
FIG. 7 is a side view of a liquid crystal display device mounted with a circuit board according to embodiment 2.

Referring to FIG. 7 showing a side view of a liquid crystal display device according to embodiment 2 of the present invention, this is described.

A liquid crystal display device according to embodiment 2 does not have the hook-shaped hook 20 provided in embodiment 1, and instead, has a swollen portion (mound 14) formed by a contraction process in an area on the liquid crystal display device 3 corresponding to the bottom of the circuit board 2.

However no mound 14 is provided only under the right end of the circuit board 2.

This secures a space necessary for engaging the engaging portion 35 of the protection cover 31 with the right end of the circuit board 2 between the circuit board 2 and the liquid crystal display device 3 and uses the right end of the circuit board 2 as a mechanism for fixing the engaging portion 35. The protection cover shown in FIG. 7 is mounted in a manner as described in the following.

First, the cover portion 12 of the protection cover is kept open and the circuit board 2 is fixed to the insulating portion 13.

A double sided adhesive tape or an adhesive agent is used for the fixing.

Next, the circuit board 2 is screwed through the insulating portion 13 to the mound 14 of the liquid crystal display device. This brings the same effect as engaging and fixing the left end of the cover portion 12 to the left end of the circuit board at the same time when fixing this circuit board.

Finally, the engaging portion 35 of the right end of the cover portion is engaged with the part at the right end of the circuit board 2 being apart from the liquid crystal display main body and thereby is fixed so that the cover portion 12 does not rise.

The protective cover shown in FIG. 7 can be mounted also by another method as described in the following.

That is, the insulating portion 13 of the protection cover is first fixed to the mound 14 of the liquid crystal display device and the cover portion 12 is kept open upward.

A double sided adhesive tape or an adhesive agent is used for the fixing.

Next, the circuit board 2 is placed on the insulating portion 13 and is screwed through the insulating portion 13 to the liquid crystal display device.

This brings the same state as a state where the left end of the cover portion 12 is engaged with and fixed to the left end of the circuit board 2.

Next, the engaging portion 35 of the protection cover is engaged with and fixed to the right end of the circuit board 2. In this embodiment 2, a mechanism of engaging the engaging portion 35 of the protection cover with the right end of the circuit board 2 is not limited to the above-mentioned mechanism.

Figure 8A:
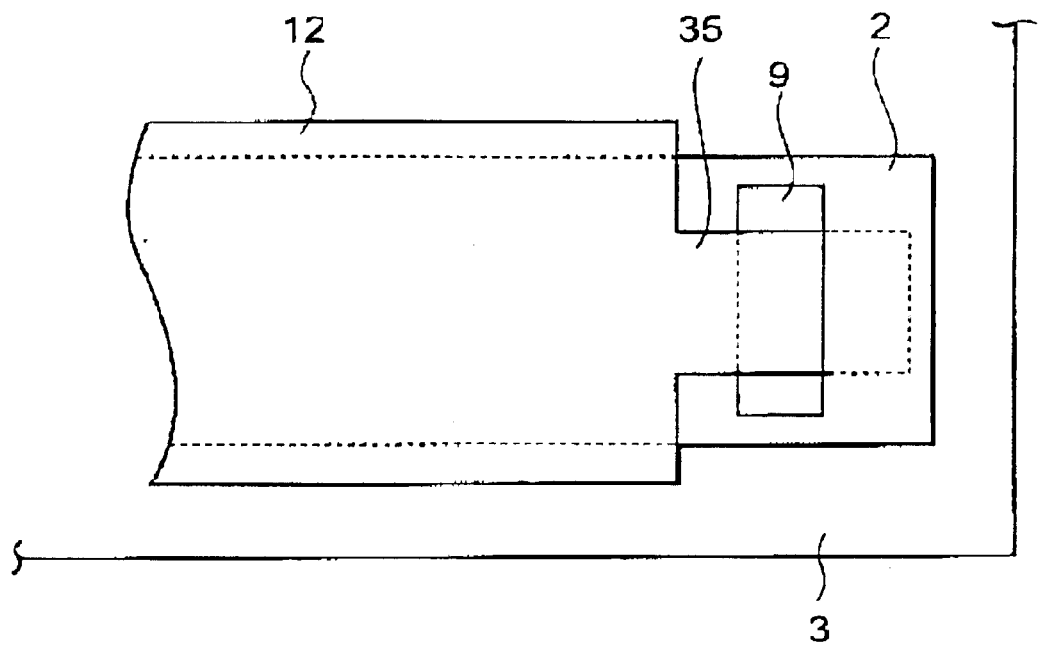
FIG. 8A is a plan view showing another example of an engaging mechanism according to embodiment 2.
Figure 8B:
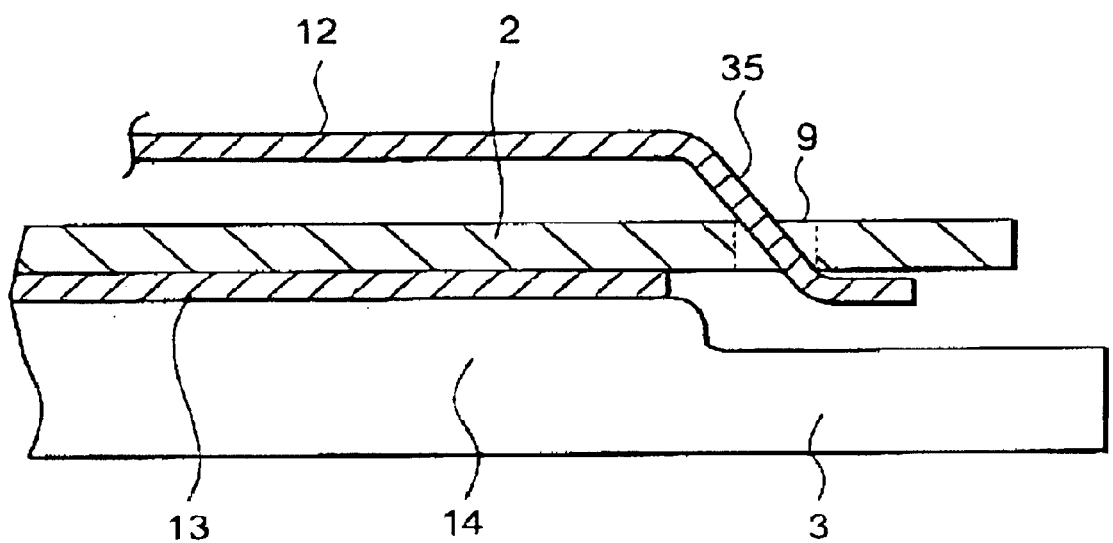
FIG. 8B is a side view of it.

As shown in a plan view and a see-through side view of a main part of an engaging mechanism of FIGS. 8A and 8B, the cover portion 12 can be fixed so as not to rise also by providing an opening 9 at an appropriate position of the right end portion of the circuit board 2 and pressing the engaging portion 35 of the protection cover into this opening 9.

In this embodiment, the mound 14 is formed by swelling the whole area of the liquid crystal display device 3 corresponding to the bottom of the circuit board 2 in the shape of a frustum of a pyramid as shown in FIG. 7, but may be formed by projecting a plurality of spots in the shape of bosses.

Next, the above-mentioned embodiment 2 is an example which provides a mound by applying a contraction process to the liquid crystal display device main body as a method for making a gap for engaging between the circuit board 2 and the liquid crystal display device 3 main body, but it is possible to provide a gap for engaging between the circuit board 2 and the liquid crystal display device 3 main body also by using a spacer.

Figure 9A:
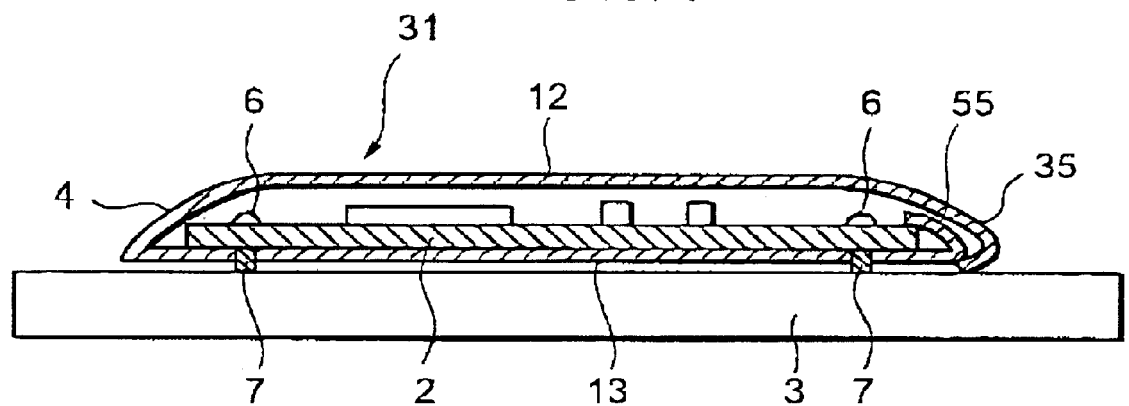
FIG. 9A is a side view of a liquid crystal display device mounted with a circuit board according to embodiment 3.

This is described with reference to FIG. 9A showing a side view of a liquid crystal display device according to embodiment 3 providing a gap using spacers.

This embodiment is different from the embodiments already described in that both a circuit board 2 and an insulating portion 13 of a protection cover are raised by spacers 7 separately from a the liquid crystal display device 3 main body, and in that an engaging portion 55 is provided by bending the right end portion of the insulating portion 13 of the protection cover upward on the page and the engaging portion 55 of the insulating portion side is engaged with the right end of the circuit board 2 together with the engaging portion 35 of the cover portion side.

The protection cover shown in FIG. 9A is mounted in the following manner.

Figure 9B:
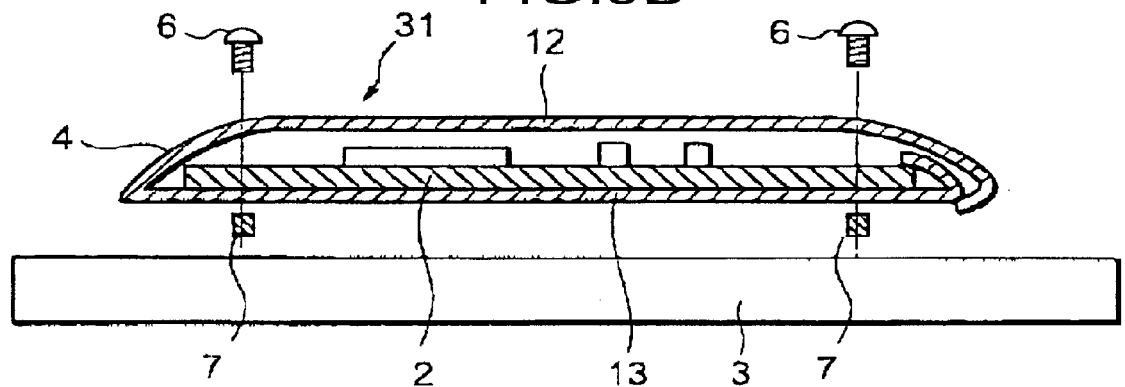
FIG. 9B is a side view of a circuit board at a midway stage of mounting a protection cover and a liquid crystal display device.

This is described with reference to FIG. 9B showing a side view at a midway stage of mounting in this embodiment.

First, the cover portion 12 of the protection cover is kept open and the engaging portion 55 at the right end of the insulating portion 13 is engaged with the right end of the circuit board from the lower side of the circuit board 2 and thereby the insulating portion 13 is mounted on the circuit board 2.

They do not need to be fixed to each other with a double sided adhesive tape or an adhesive agent.

Next, spacers are inserted between the insulating portion 13 of the protection cover and the liquid crystal display device 3, and the circuit board 2 is screwed through the spacers to the liquid crystal display device 3.

Finally, as covering the engaging portion 55 of the insulating portion 13 side with the engaging portion 35 of the cover portion 12 side, the engaging portion 35 of the cover portion 12 is engaged with the right end of the circuit board and thereby is fixed so that the cover portion 12 does not rise. The liquid crystal display device of embodiment 3 shown in FIG. 9A is an example interposing spacers 7 between the insulating portion 13 of the protection cover and the liquid crystal display device 3, but the spacers 7 may be inserted between the circuit board 2 and the insulating portion 13 of the protection cover like embodiment 4 shown next.

Figure 10:
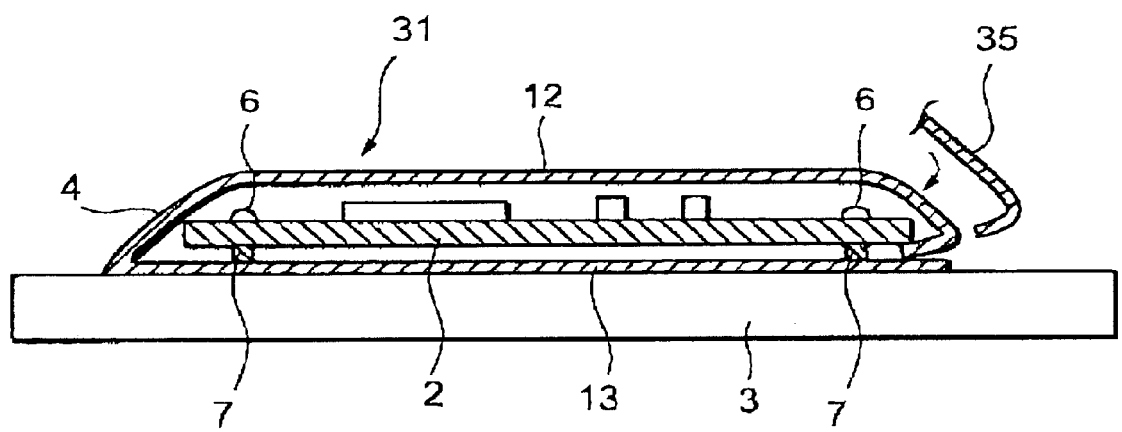
FIG. 10 is a side view of a liquid crystal display device mounted with a circuit board according to embodiment 4.

This example is described with reference to FIG. 10 showing a side view of a liquid crystal display device according to embodiment 4. In this embodiment, the insulating portion 13 of the protection cover is fixed to the liquid crystal display device 3 main body and the circuit board 2 is raised by the spacers 7 inserted between the circuit board 2 and the insulating portion 13 and thereby a gap for engaging the engaging portion 35 of the protection cover is provided between the circuit board 2 and the liquid crystal display device 3 main body.

The protection cover of embodiment 4 shown in FIG. 10 is mounted in the following manner.

First, the insulating portion 13 of the protection cover is fixed to the liquid crystal display device 3 main body, and the cover portion 12 is kept open.

A double sided adhesive tape, an adhesive agent or the like is used for fixing the insulating portion 13. Next, spacers 7 are inserted between the insulating portion 13 of the protective cover and the circuit board 2, and the circuit board 2 is screwed through the spacers 7 to the liquid crystal display device 3 main body.

And finally, the engaging portion 35 of the protection cover is engaged with the right end of the circuit board 2 and thereby the cover portion 12 is fixed so as not to rise. In embodiments 3 and 4, it is assumed that a spacer 7 is in the shape of a cylinder for example, but it is a matter of course that the spacer 7 may be in the shape of a square tube and further it may be a spacer being in a shape spreading all over the bottom of the circuit board 2 (however, except the end parts of the circuit board).

Next, although all of embodiments 1 to 4 described up to now are examples using protection covers of so-called one-body type each being made of a single plate having the insulating portion 13 and the cover portion 12 connected with each other, in the following embodiment an example using a protection cover of a so-called separate type in which the insulating portion and the cover portion are separated is described.

Figure 11A:
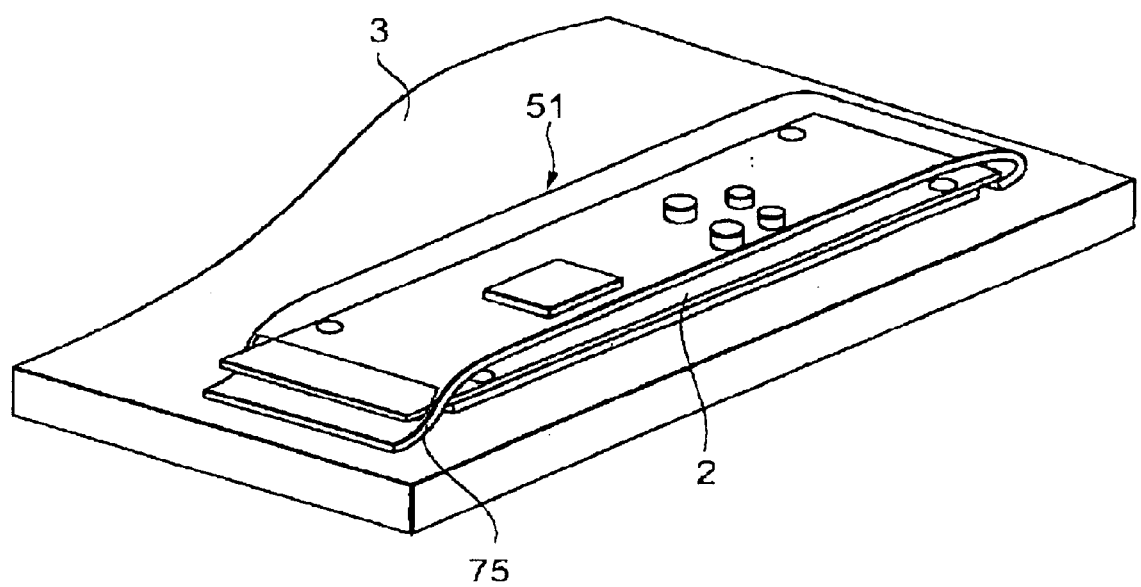
FIG. 11A is a see-through perspective view of a liquid crystal display device mounted with a circuit board according to embodiment 5.
Figure 11B:
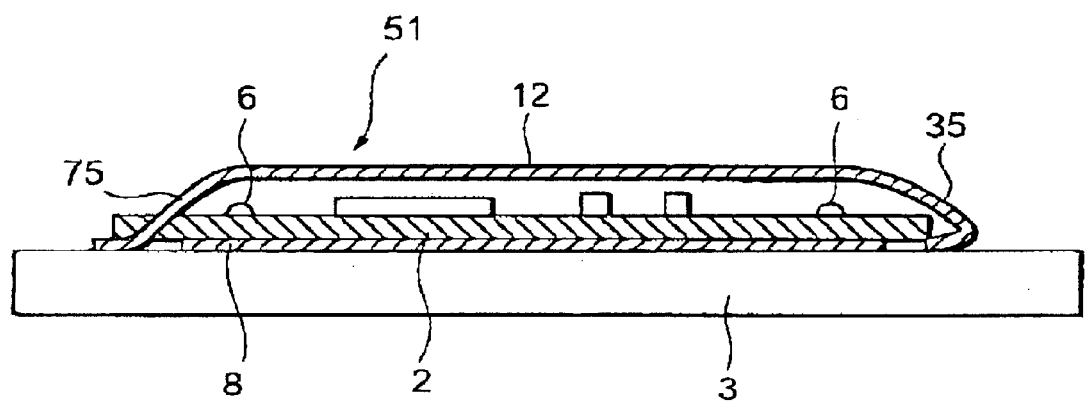
FIG. 11B is a side view of it.
Figure 12:
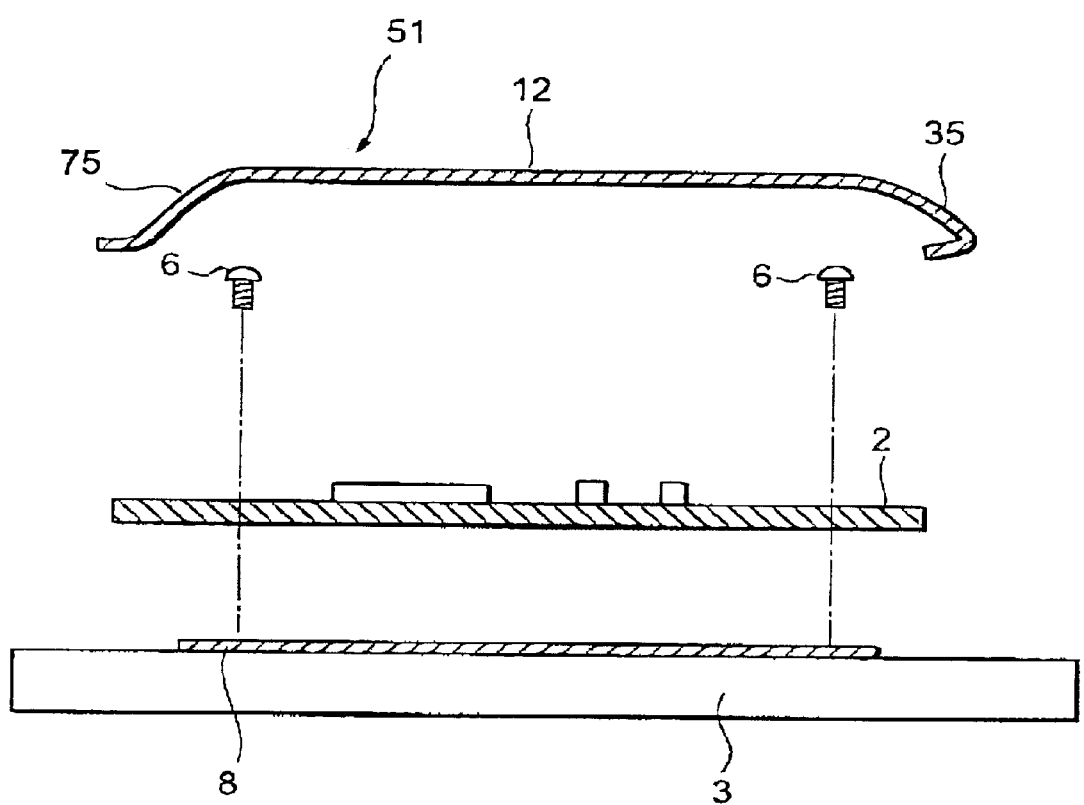
FIG. 12 is a side view of a circuit board at a midway stage of mounting a protection cover and a liquid crystal display device in embodiment 5.

FIG. 11 shows a see-through perspective view and a side view of a liquid crystal display device according to embodiment 5 showing an example using a protection cover of a separate type. And FIG. 12 shows a side view at a midway stage of mounting in this embodiment. First, the composition of this embodiment is described with reference to FIG. 11.

This embodiment separates a protection cover 51 and an insulating means from each other.

The protection cover 51 aims at only protecting components mounted on a circuit board, and comprises a cover portion 12 and the right and left engaging portions 35 and 75 provided by bending both ends of it.

On the other hand, the insulating portion aims at only electrically insulating the circuit board 2 and the liquid crystal display device from each other, and is formed out of a single insulating sheet 8.

And a gap to be provided between the circuit board 2 and the liquid crystal display device 3 main body is obtained by this insulating sheet 8. Since the cover portion 12 of the protection cover and the insulating sheet 8 are separate, the thickness of the insulating sheet 8 can be made to be a necessary thickness for forming a gap independently of the cover portion 12. In this embodiment, as shown in FIGS. 11A and 12, an opening is provided in the engaging portion 75 at the left side of the cover portion 12 in advance and the left end of the circuit board 2 is passed through this opening and thereby the left end of the cover portion 12 is engaged with the left end of the circuit board 2. Next, the engaging portion 35 at the right side of the cover portion is engaged with the right end of the circuit board from the outside and thereby the cover portion 12 is fixed so as not to rise. For this, the insulating sheet 8 is kept in a state where both ends of it are withdrawn from the circuit board 2.

The protection cover shown in FIG. 11 is mounted in the following manner.

This is described with reference to FIG. 12 showing a side view at a midway stage of mounting in this embodiment. First, the insulating sheet 8 is fixed to the liquid crystal display device 3. A double sided adhesive tape or an adhesive agent is used for the fixing.

Next, the circuit board 2 is placed on the insulating sheet 8 and is screwed through the insulating sheet 8 to the liquid crystal display device 3. Next, the left end of the circuit board 2 is passed through an opening provided near the left end of the protection cover 51 and the engaging portion 75 is engaged with the left end of the circuit board 2.

Finally the engaging portion 35 at the right end of the protection cover 51 is engaged with the right end of the circuit board 2 from the outside and thereby the cover portion 12 is fixed so as not to rise.

This embodiment also more reduces the manufacturing cost in comparison with a conventional protective cover due to simplifying an operation of mounting the protective cover 51.

Figure 13A:
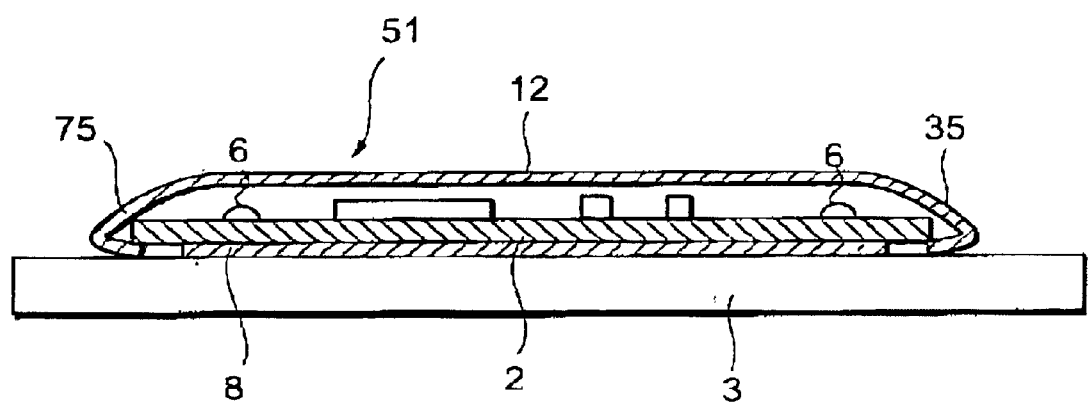
FIG. 13A is a side view of a liquid crystal display device mounted with a circuit board according to embodiment 6.
Figure 13B:
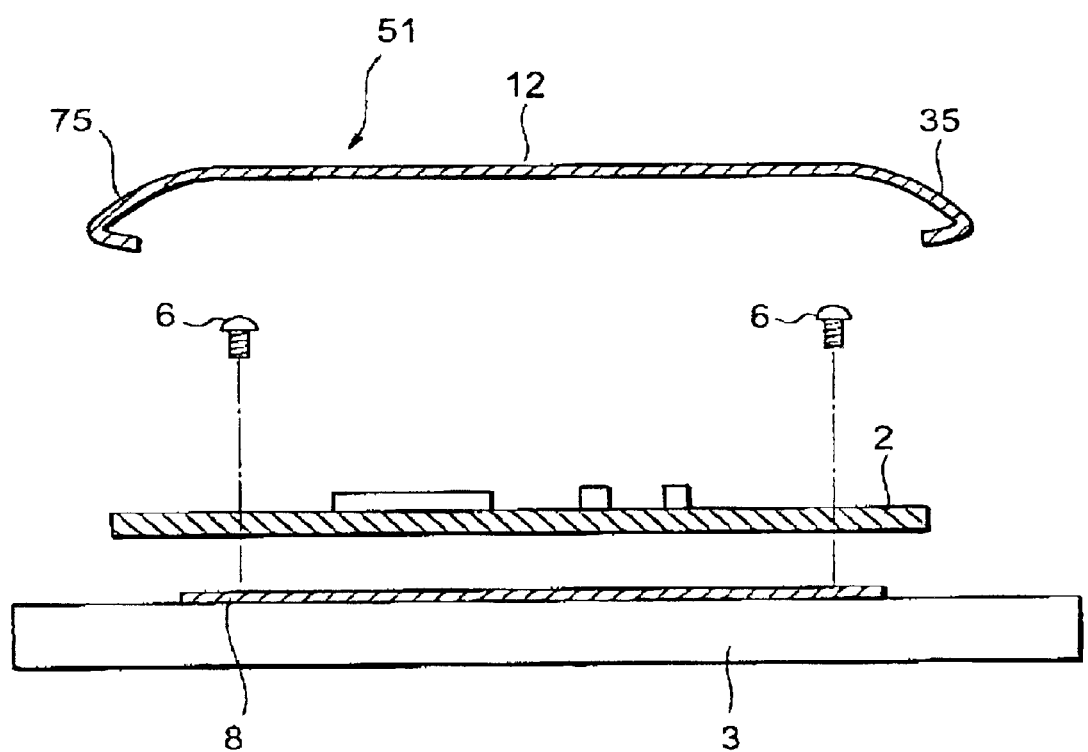
FIG. 13B is a side view of a circuit board at a midway stage of mounting a protection cover and a liquid crystal display device.

In embodiments 2 to 4 described above, an insulating portion is interposed between a liquid crystal display device and a circuit board, but in case that a liquid crystal display device 3 itself is of insulation and an insulating means is not necessary between the circuit board 2 and the liquid crystal display device 3, it is enough that without providing an insulating portion, a mound is provided on the liquid crystal display main body or a spacer is provided between the circuit board and the liquid crystal display device and thereby a gap necessary for engaging is provided between the circuit board and the liquid crystal display device main body, and the protection cover is fixed at its end portion by this gap and thereby the circuit board is shielded from the outside. Embodiment 5 shown in FIG. 11 can be modified into embodiment 6 described below. This is described with reference to FIGS. 13A and 13B showing a side view of a liquid crystal display device completed according to embodiment 6 and a side view at a midway stage of mounting a protection cover of it. A liquid crystal display device according to this embodiment is different from embodiment 5 in that both of the engaging portions 35 and 75 of the protection cover are engaged with both ends of the circuit board 2.

Even in case of using a circuit board as a part of an engaging mechanism similarly in such a manner, the protection cover can be easily fixed so as not to rise by means of a method different from embodiment 5.

Hereupon, a method for fixing a protection cover 51 to a circuit board 2 so as not to rise in a separator-type protective cover is not limited to such a method as described in embodiment 5 or 6.

Figure 14A:
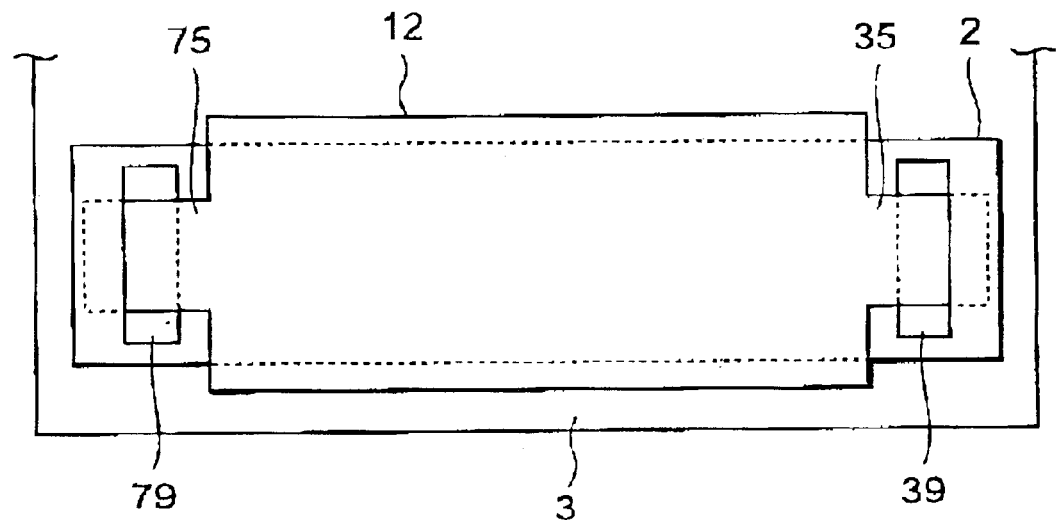
FIG. 14A is a see-through plan view showing other several examples of an engaging mechanism.

As shown in a schematic see-through plan view of FIG. 14A, a structure may be used where openings 39 and 79 are provided respectively at both end portions of a circuit board 2, and the two right and left engaging portions 35 and 75 of a protection cover are respectively pressed into the openings 39 and 79.

Figure 14B:
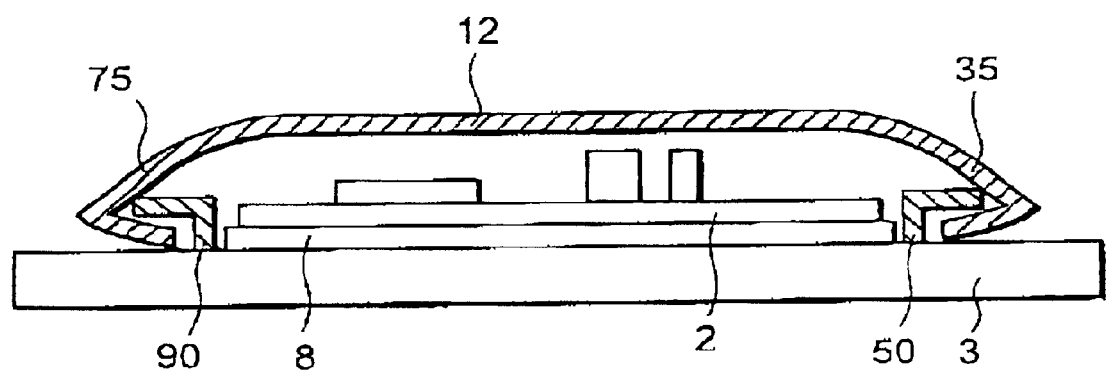
FIGS. 14B and 14C are side views of them.
Figure 14C:
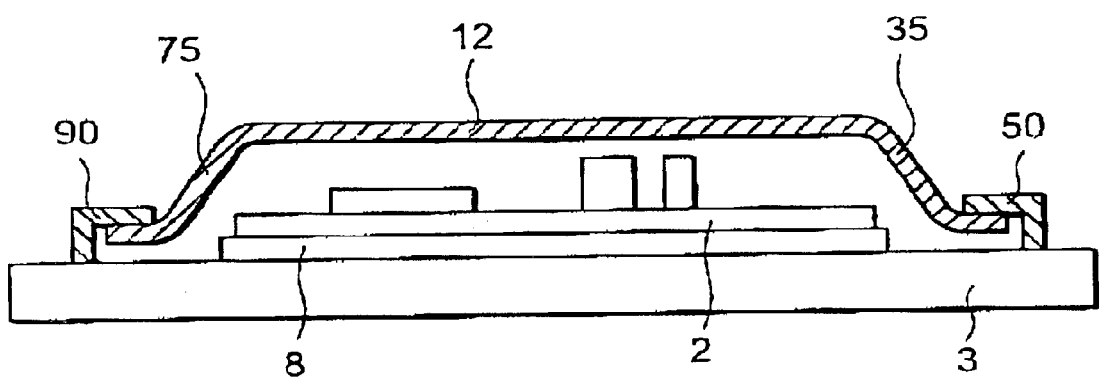

And instead of engaging with the ends of the circuit board 2, as shown in a schematic side view of FIG. 14B, a structure may be adopted where hook-shaped hooks 50 and 90 facing outward similar to embodiment 1 are provided near both ends of the circuit board 2 on a liquid crystal display device 3 and both engaging portions 35 and 75 of the protection cover are respectively engaged with the hooks 50 and 90 from the outside. And as shown schematically in a side view of FIG. 14C, a structure may be adopted where hook-shaped hooks 50 and 90 facing inward are provided on a liquid crystal display device, and both engaging portions 35 and 75 of the protection cover are respectively pressed into the hooks 50 and 90 from the inside. Further, a structure may be used where one end side of the protection cover utilizes an end of the circuit board itself or utilizes an opening provided at an end portion of the circuit board and the other end side is engaged with a hook. Or a method of inserting a circuit board into an opening provided in an end portion of a protection cover and engaging the other end of the protection cover with a hook-shaped hook may be adopted.

By the way, a component being remarkable in generation of heat like an IC 15 for example is often mounted on a circuit board 2.

Figure 15:
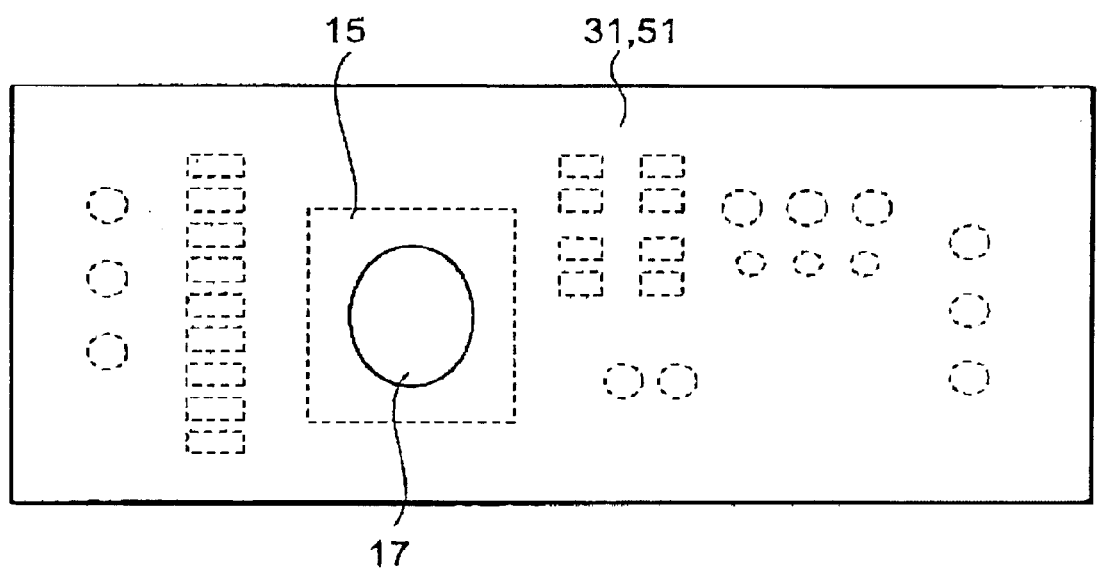
FIG. 15 is a see-through plan view of a protection cover provided with an opening for radiation of heat.

In case that radiation of heat is hindered by mounting a protection cover 31 (or 51) in such a circuit board, a measure of making a radiation opening 17 at a position in the protection cover 31 (or 51) where a component being remarkable in generation of heat is mounted can be taken, as shown in FIG. 15.

Although each of the above-mentioned embodiments has been described using an example in which a circuit board for driving a liquid crystal is mounted on a liquid crystal display device, it is apparent that the present invention is not limited to a liquid crystal display device but brings the same effect as the embodiments also to another electronic device and its circuit board. As described above, according to the present invention, it is possible to suppress to the utmost an increase in thickness of an electronic device and a rise in manufacturing cost in case of protecting components mounted on a circuit board mounted on an electronic device with a protection cover from an external force. The present invention exhibits a particularly remarkable effect when applied to a liquid crystal display device.

What is claimed is:

1. A protection structure of a circuit board, comprising:
   a circuit board fixed to an electronic device;
   electronic components mounted on said circuit board; and
   a protection cover for protecting said electronic components; wherein:
   at least one end of said protection cover is engaged with and fixed to a protection cover fixing means provided on at least one of said circuit board and said electronic device so as to be freely opened and closed utilizing its elasticity.

2. A protection structure of a circuit board according to claim 1, wherein:

said protection cover fixing means is a hook portion formed out of a hook-shaped structure projecting at one end of said circuit board.

3. A protection structure of a circuit board according to claim 1, wherein:

said protection cover fixing means is a hook portion formed out of a hook-shaped structure projecting on said electronic device near one end of said circuit board.

4. A protection structure of a circuit board according to claim 1, wherein:

said protection cover is provided with a first engaging portion to be engaged with said electronic device side at one end of it, a protection portion which starts from said first engaging portion, reaches the electronic component mounting face of said circuit board as being curved and extends to the other end of said circuit board and thereby covers electronic components mounted on said circuit board, and a second engaging portion provided by bending the fore-end portion of said protection portion, wherein;

at least one of said first and second engaging portions is fixed to said protection cover so as to be freely opened and closed.

5. A protection structure of a circuit board according to claim 4, wherein:

the protection portion of said protection cover is made not to rise apart from the electronic component mounting face of said circuit board by engaging at least one engaging portion of said protection cover with said protection cover fixing means.

6. A protection structure of a circuit board according to claim 1, wherein:

an insulating plate is provided between said electronic device and said circuit board.

7. A protection structure of a circuit board according to claim 6, wherein;

one end of said protection cover is freely opened and closed, the other end is fixed to said electronic device side, and said insulating plate is made to extend from the other end of said protection cover under said circuit board.

8. A protection structure of a circuit board according to claim 6, wherein:

said insulating plate is a structure separate from said protection cover.

9. A protection structure of a circuit board according to claim 1, wherein:

said protection cover fixing means is provided with a gap forming means for providing a gap necessary for engaging at least one engaging portion of said protection cover with an end of said circuit board between said circuit board and said electronic device.

10. A protection structure of a circuit board according to claim 9, wherein:

said gap forming means is a contraction-processed portion obtained by pressing out a part of the mounting surface of said electronic device on which said circuit board is to be mounted.

11. A protection structure of a circuit board according to claim 9, wherein:

said gap forming means is a spacer interposed between said circuit board and said electronic device.

12. A protection structure of a circuit board according to claim 9, wherein:

said gap forming means is an insulating plate interposed between said circuit board and said electronic device.

13. A protection structure of a circuit board according to claim 1, wherein:

said electronic device is a liquid crystal display device.

14. A method for manufacturing a protection structure comprising the steps of:

fixing a circuit board to an electronic device, and protecting a side of said circuit board being not covered with said electronic device from the outside by engaging at least one end of a protection cover with a protection cover fixing means provided on said electronic device side.

15. A method for manufacturing a protection structure according to claim 14, wherein:

said step of fixing said circuit board to said electronic device is performed by simultaneously fixing a separate insulating plate between said electronic device and said circuit board additionally to fixing said electronic device and said circuit board, and is provided with a step of protecting a side of said circuit board being not covered with said electronic device from the outside by engaging at least one end of said protection cover with said protection cover fixing means provided on said electronic device side.

16. A method for manufacturing a protection structure according to claim 14, wherein:

said step of fixing said circuit board to said electronic device is performed by fixing an insulating plate to said electronic device and thereafter fixing said circuit board to said electronic device through said insulating plate fixed to said electronic device, and is provided with a step of protecting a side of said circuit board being not covered with said electronic device from the outside by engaging at least one end of said protection cover with said protection cover fixing means provided on said electronic device side.

17. A method for manufacturing a protection structure according to claim 16, wherein:

said step of fixing said circuit board to said electronic device through said insulating plate fixed to said electronic device interposes a spacer between said circuit board and said insulating plate.

18. A method for manufacturing a protection structure according to claim 14, wherein:

said step of fixing said circuit board to said electronic device is performed by fixing an insulating plate to said circuit board and thereafter fixing said circuit board having said insulating plate fixed on it to said electronic device through said insulating plate, and is provided with a step of protecting a side of said circuit board being not covered with said electronic device from the outside by engaging at least one end of said protection cover with said protection cover fixing means provided on said electronic device side.

19. A method for manufacturing a protection structure according to claim 17, wherein:

said step of fixing said circuit board having said insulating plate fixed on it to said electronic device interposes a spacer between said insulating plate and said electronic device.

20. A method for manufacturing a protection structure according to claim 14, wherein:

said electronic device is a liquid crystal display device.

* * * * *